US012607659B2

(12) United States Patent
Chang et al.

(10) Patent No.: US 12,607,659 B2
(45) Date of Patent: Apr. 21, 2026

(54) METHOD AND SYSTEM FOR DETECTING APPLICATION PROGRAM VERSION WITH ABNORMAL POWER CONSUMPTION

(71) Applicant: ASUSTeK COMPUTER INC., Taipei City (TW)

(72) Inventors: Chin-Hao Chang, Taipei City (TW);
Shih-Chieh Liao, Taipei City (TW);
Tzu-Hung Chuang, Taipei City (TW);
Shih-Chuan Chiu, Taipei City (TW);
Yi-Nan Lee, Taipei City (TW)

(73) Assignee: ASUSTeK COMPUTER INC., Taipei City (TW)

( * ) Notice: Subject to any disclaimer, the term of this patent is extended or adjusted under 35 U.S.C. 154(b) by 597 days.

(21) Appl. No.: 17/983,366

(22) Filed: Nov. 8, 2022

(65) Prior Publication Data

US 2023/0408562 A1     Dec. 21, 2023

(30) Foreign Application Priority Data

Jun. 16, 2022     (TW) .................................. 111122322

(51) Int. Cl.
*G01R 21/00*          (2006.01)
*G06F 1/30*          (2006.01)
(52) U.S. Cl.
CPC ............... *G01R 21/00* (2013.01); *G06F 1/30* (2013.01)
(58) Field of Classification Search
CPC ..... G01R 21/00; G01R 29/00; G06F 11/3062; G06F 11/302; G06F 11/008; G06F 1/30; G06F 2201/865; G06F 2209/501

USPC ...... 73/865.9, 195; 700/9; 702/58, 183, 188, 702/182, 189, 185, 187, 64, 61, 57, 1, 60, 702/127

See application file for complete search history.

(56) References Cited

U.S. PATENT DOCUMENTS

| | | | |
|---|---|---|---|
| 8,990,637 B1 * | 3/2015 | Vlachogiannis | .... G06F 11/3003 714/47.1 |
| 9,098,333 B1 * | 8/2015 | Obrecht | .................... G06F 9/50 |
| 11,277,798 B2 * | 3/2022 | Zhao | ........................ G06F 1/329 |
| 11,422,605 B2 | 8/2022 | Mn et al. | |
| 2013/0031385 A1 * | 1/2013 | Seto | ......................... G06F 1/28 713/300 |

(Continued)

FOREIGN PATENT DOCUMENTS

| | | | | |
|---|---|---|---|---|
| CN | 104239111 | | 12/2014 | |
| CN | 104267799 A | * | 1/2015 | ........... G06F 1/3209 |

(Continued)

*Primary Examiner* — Jeffrey P Aiello
(74) *Attorney, Agent, or Firm* — JCIPRNET

(57)     ABSTRACT

A method and a system for detecting an application program version with abnormal power consumption are provided. The method includes the following. A power consumption database of multiple versions of a target application is established. Power consumption information of a target version of the target application is obtained. According to the power consumption database and the power consumption information, whether the target version of the target application has a first abnormal power consumption state evaluated based on different versions of the target application is determined. In response to the first abnormal power consumption state, an abnormal power consumption prompt corresponding to the target version is generated.

12 Claims, 3 Drawing Sheets

11 processor

12 input/output interface storage circuit power consumption database

13

14

10

(56) References Cited

U.S. PATENT DOCUMENTS

| | | | | |
|---|---|---|---|---|
| 2013/0174128 A1* | 7/2013 | Kansal | ............... | G06F 11/3062 |
| | | | | 717/124 |
| 2015/0026487 A1* | 1/2015 | Choi | ................... | G06F 9/4893 |
| | | | | 713/300 |
| 2016/0048682 A1* | 2/2016 | Gou | ........................ | H04W 4/00 |
| | | | | 726/22 |
| 2016/0073351 A1* | 3/2016 | Cardozo | .......... | H04W 52/0258 |
| | | | | 455/574 |
| 2016/0209906 A1* | 7/2016 | Chae | ........................ | G06F 1/329 |
| 2016/0252944 A1* | 9/2016 | Kim | ................. | H04W 52/0264 |
| | | | | 713/340 |
| 2019/0361513 A1* | 11/2019 | Tomoda | .................. | H04M 1/73 |
| 2021/0208662 A1* | 7/2021 | Yin | ................... | H04W 52/0225 |
| 2022/0164175 A1* | 5/2022 | Masis | ................... | G06F 3/0484 |

FOREIGN PATENT DOCUMENTS

| | | | | | |
|---|---|---|---|---|---|
| CN | 107391348 A | * | 11/2017 | .............. | G06F 11/32 |
| CN | 110945896 | | 10/2021 | | |
| CN | 114281644 A | * | 4/2022 | | |
| WO | WO-2014143549 A1 | * | 9/2014 | .......... | G06F 1/3218 |
| WO | WO-2017198025 A1 | * | 11/2017 | .............. | G06F 11/32 |
| WO | 2019071615 | | 4/2019 | | |

\* cited by examiner

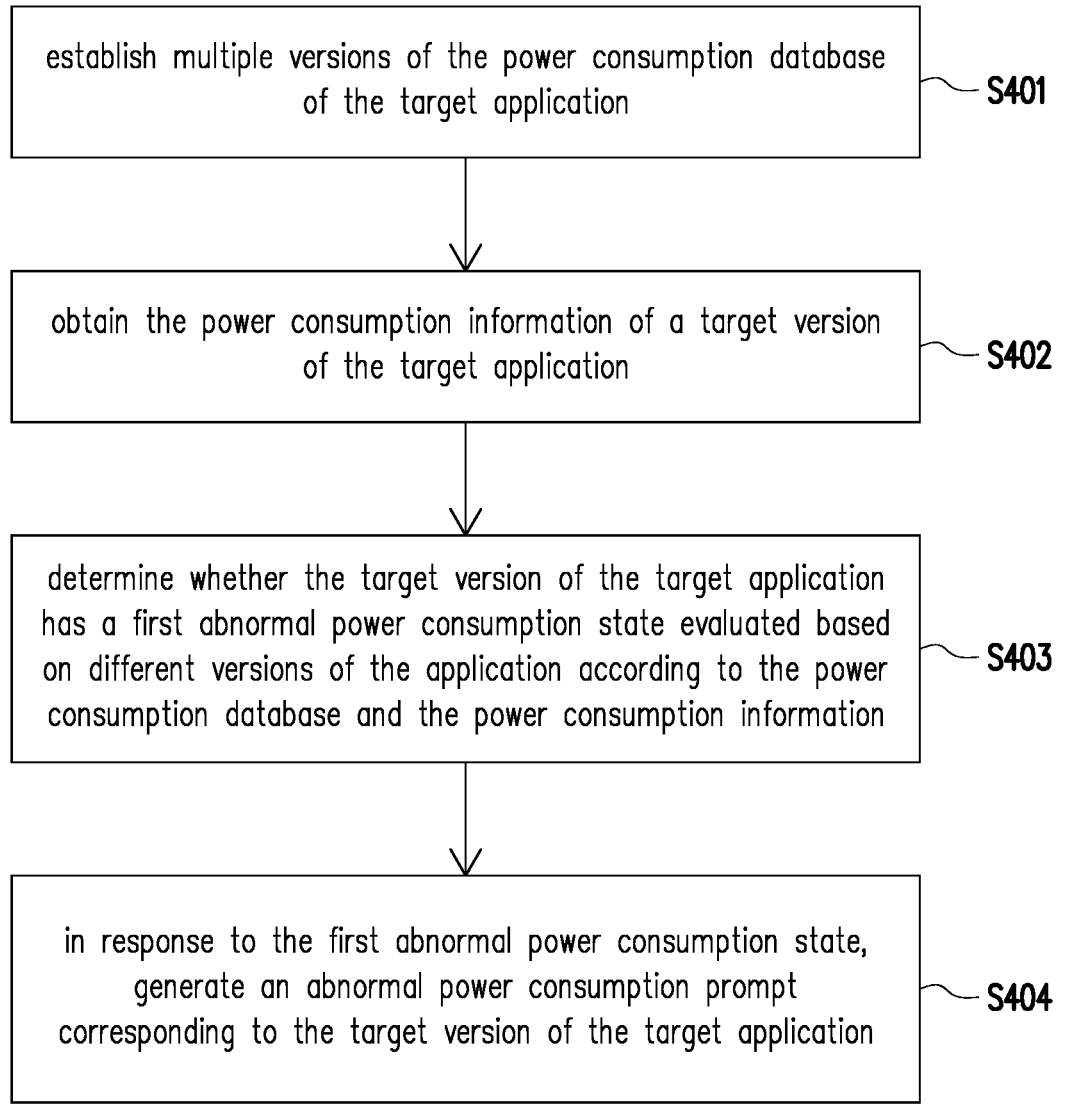

establish multiple versions of the power consumption database of the target application — S401 obtain the power consumption information of a target version of the target application — S402 determine whether the target version of the target application has a first abnormal power consumption state evaluated based on different versions of the application according to the power consumption database and the power consumption information — S403 in response to the first abnormal power consumption state, generate an abnormal power consumption prompt corresponding to the target version of the target application — S404

FIG. 4

METHOD AND SYSTEM FOR DETECTING APPLICATION PROGRAM VERSION WITH ABNORMAL POWER CONSUMPTION

CROSS-REFERENCE TO RELATED APPLICATION

This application claims the priority benefit of Taiwan application serial no. 111122322, filed on Jun. 16, 2022. The entirety of the above-mentioned patent application is hereby incorporated by reference herein and made a part of this specification.

BACKGROUND

Technical Field

This disclosure relates to a method and a system for detecting application program version with abnormal power consumption.

Description of Related Art

Generally speaking, applications are updated several times after they go online to correct program defects or add new program features, etc. However, in some cases, electronic devices running a specific version of an application may cause abnormal power consumption of the device, resulting in troublesome usage.

SUMMARY

The disclosure provides a method and a system for detecting application program version with abnormal power consumption, which may improve the above problems. The method for detecting application program version with abnormal power consumption includes: establishing a power consumption database of a plurality of versions of a target application; obtaining power consumption information of a target version of the target application; determining whether the target version of the target application has a first abnormal power consumption state evaluated based on different versions of the target application according to the power consumption database and the power consumption information; and in response to the first abnormal power consumption state, generating an abnormal power consumption prompt corresponding to the target version.

The system for detecting application program version with abnormal power consumption includes a storage circuit and a processor. The processor is coupled to the storage circuit. The processor is configured to establish a power consumption database of multiple versions of a target application; obtain power consumption information of a target version of the target application; determine, according to the power consumption database and the power consumption information, whether the target version of the target application has a first abnormal power consumption state evaluated based on different versions of the target application; and in response to the first abnormal power consumption state, generate an abnormal power consumption prompt corresponding to the target version.

Based on the above, after establishing the power consumption database of multiple versions of the target application and obtaining the power consumption information of the target version of the target application, the power consumption database and the power consumption information may be used to determine whether the target version of the target application has the first abnormal power consumption state. In particular, the first abnormal power consumption state is evaluated based on different versions of the target application. In response to the first abnormal power consumption state, an abnormal power consumption prompt corresponding to the target version may be generated. In this way, users may clearly know whether a specific application or a specific version is causing abnormal power consumption of the electronic device at the moment or in the past, so that they can implement solutions, such as restoring the previous version and/or reporting abnormal application versions.

To make the aforementioned more comprehensible, several accompanied with drawings are described in detail as follows.

BRIEF DESCRIPTION OF THE DRAWING

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 4 is a flow chart according to a method for detecting an application program version with abnormal power consumption of the disclosure.

DESCRIPTION OF THE EMBODIMENTS

Figure 1:
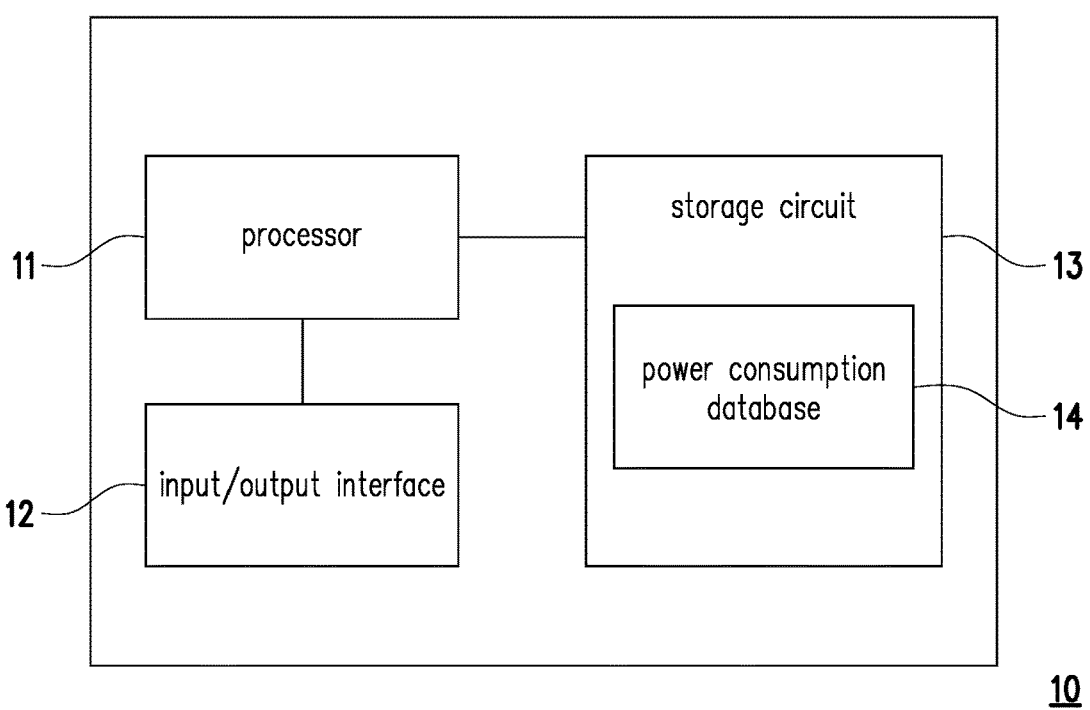
FIG. 1 is a schematic diagram of a system for detecting an application program version with abnormal power consumption according to an embodiment of the disclosure.

Referring to FIG. 1, a system 10 (also known as a system for detecting an application program version with abnormal power consumption) may be installed or implemented in various computer systems such as smartphones, tablets, laptops, desktops, or servers, and the type of the computer system is not limited thereto.

The system 10 for detecting an application program version with abnormal power consumption may include a processor 11, an input/output (IO) interface 12 and a storage circuit 13. The processor 11 is configured to detect the overall or partial operation of the system 10 for detecting an application program version with abnormal power consumption. For example, the processor 11 may include a central processing unit (CPU) or other programmable general-purpose or special-purpose microprocessor, digital signal processor (DSP), programmable control device, application specific integrated circuit (ASIC), programmable logic device (PLD), or other similar devices or combinations of these devices.

The input/output interface 12 is coupled to the processor 11. The input/output interface 12 is configured to receive input signals or output signals. For example, the input/output interface 12 may include various input/output devices such as a mouse, keyboard, monitor, network interface card, speaker, or microphone, and the type of the input/output interface 12 is not limited thereto.

The storage circuit 13 is coupled to the processor 11. The storage circuit 13 is configured to store data. For example, the storage circuit 13 may include a volatile storage circuit and a non-volatile storage circuit. The volatile storage circuit is configured to voluntarily store data. For example, the volatile storage circuit may include random access memory (RAM) or similar volatile storage media. The non-volatile storage circuit is configured to store data in a non-volatile manner. For example, the non-volatile storage circuit may include read only memory (ROM), solid state disk (SSD), hard disk drive (HDD), or similar non-volatile storage media.

The processor 11 may create a power consumption database 14 of multiple versions of a specific application (also called a target application). The power consumption database 14 may be stored in the storage circuit 13. The power consumption database 14 may be configured to store power consumption information of different versions of one or more applications. For example, the power consumption information may include power consumption per unit time, which reflects the power consumption per unit time of a particular electronic device (e.g., a smartphone, tablet, laptop, desktop, or server) while running one or more applications. For example, the unit time may be in minute, hour, day, week or other unit time, without limitation in this disclosure.

In particular, the power consumption database 14 may further store power consumption information based on different versions of the application. For example, assuming that four versions of an application have been released since its launch, the power consumption database 14 may store the power consumption information for each version of the application.

Figure 2:
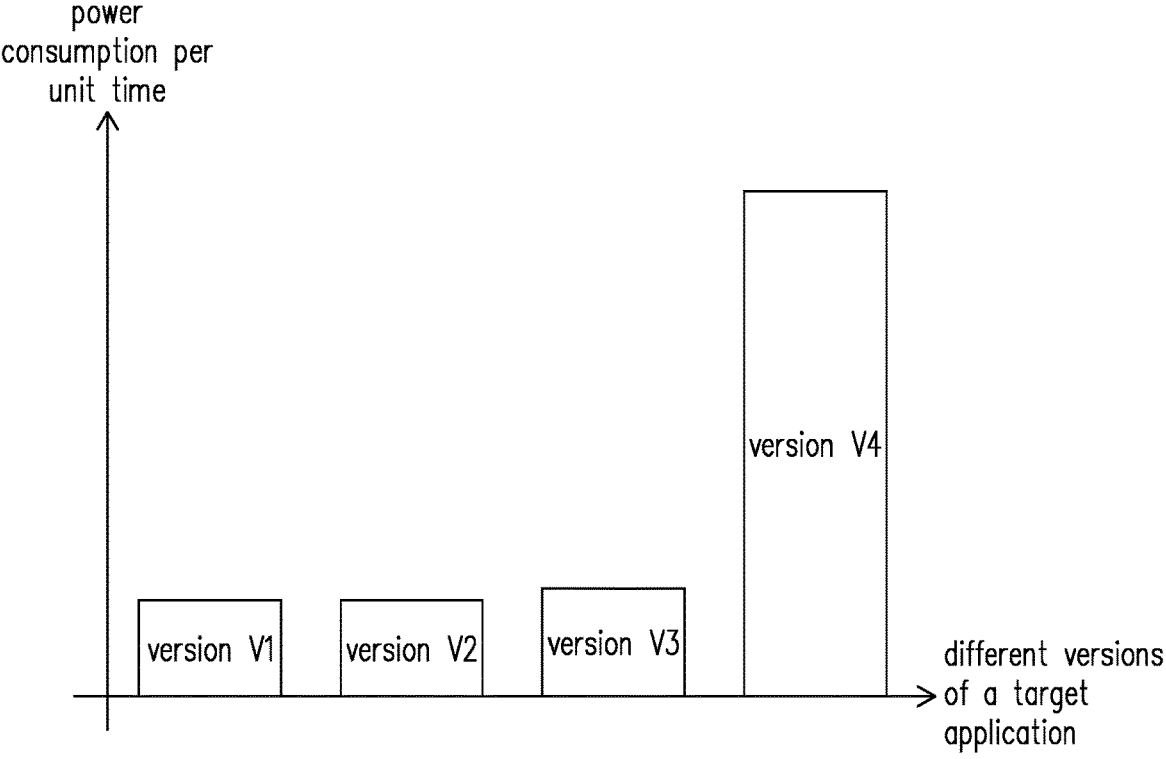
FIG. 2 is a schematic diagram of power consumption per unit time for different versions of a target application according to an embodiment of the disclosure.

Referring to FIG. 1 and FIG. 2, according to an embodiment, the power consumption information (e.g., power consumption per unit time) for four versions V1 to V4 of the target application stored in the power consumption database 14 can be represented by the bar graph in FIG. 2. The horizontal axis of the bar graph corresponds to different versions of the target application, and the vertical axis corresponds to the power consumption per unit time of each version of the target application. For example, in FIG. 2, the power consumption per unit time of the version V4 of the target application is significantly higher than the power consumption per unit time of the other versions V1 to V3 of the target application.

It should be noted that, according to the embodiment of FIG. 2, version information of the four versions V1 to V4 of the target application are different. For example, the version information of the four versions V1 to V4 of the target application may include "version 1.1", "version 1.2", "version 1.3", "version 1.4", etc., and it is not limited thereto. In addition, a total number of versions of the target application may be 2, 3 or 5, etc., without limitation in this disclosure.

The processor 11 may obtain the power consumption information of a specific version (also called a target version) of the target application. The processor 11 may determine whether the target version of the target application has an abnormal power consumption state (also called a first abnormal power consumption state) according to the power consumption database 14 and the power consumption information of the target version of the target application. In particular, the first abnormal power consumption state is evaluated based on different versions of the target application, not simply on the power consumption of the target application itself or of the target application in relation to other applications. When the first abnormal power consumption state is detected, in response to the first abnormal power consumption state, the processor 11 may generate an abnormal power consumption prompt corresponding to the target version.

For example, in FIG. 2, assuming that the target version of the target application is the version V4, in response to the fact that the power consumption per unit time of the version V4 of the target application is significantly higher than the power consumption per unit time of the remaining versions V1 to V3 of the target application, the processor 11 may determine that the target version of the target application has the first abnormal power consumption state. In response to the first abnormal power consumption state, the processor 11 may generate the abnormal power consumption prompt corresponding to the target version of the target application. For example, the abnormal power consumption prompt may be published on an online platform and/or provided to a user device having the target application (or the target version of the target application) to alert the user to the abnormal power consumption state of the version V4 of the target application. Alternatively, assuming that the target version of the target application is any of the versions V1 to V3, the processor 11 may not generate an abnormal power consumption prompt corresponding to the target version of the target application.

According to an embodiment, the processor 11 may obtain the power consumption per unit time of the target version of the target application. The processor 11 may determine whether the power consumption per unit time of the target version of the target application meets a specific condition (also called a default condition). In response to the fact that the power consumption per unit time of the target version meets the default condition, the processor 11 may determine that the target version of the target application has the first abnormal power consumption state.

According to an embodiment, the processor 11 may perform a first determination operation. In the first determination operation, the processor 11 may determine whether the power consumption per unit time of the target application whose current version is the target version is higher than Q times standard deviation of the power consumption per unit time of the target application in past P unit time. Both P and Q can be 3 or other positive integer greater than 1. If yes (i.e., the power consumption per unit time of the target application whose current version is the target version is higher than Q times standard deviation of the power consumption per unit time of the target application in past P unit time), the processor 11 may determine that the target version of the target application has the first abnormal power consumption state. If not, the processor 11 may determine that the target version of the target application does not have the first abnormal power consumption state.

According to an embodiment, the processor 11 may perform a second determination operation. In the second determination operation, the processor 11 may determine whether the target application whose current version is the target version has a moving average rate of increase in the power consumption per unit time over R unit time higher than a threshold (also called a first threshold). R can be 3 or other positive integer greater than 1. If yes (i.e., the target application whose current version is the target version has a moving average rate of increase in the power consumption per unit time over R unit time higher than the first threshold), the processor 11 may determine that the target version of the target application has the first abnormal power consumption state. If not, the processor 11 may determine that the target version of the target application does not have the first abnormal power consumption state.

According to an embodiment, the processor 11 may perform a third determination operation. In the third determination operation, the processor 11 may obtain average power consumption per unit time (also called a first average power consumption per unit time) of the target application regardless of version, and average power consumption per unit time (also called a second average power consumption per unit time) of remaining versions of the target application other than the target version. The processor 11 may determine whether the target version has the first abnormal power consumption state according to a difference between the first average power consumption per unit time and the second average power consumption per unit time.

For example, in the third determination operation, the processor 11 may determine whether the target version has the first abnormal power consumption state according to the following equation (1.1).

$$IR=((P1-P2)/P1)\times100\% \qquad (1.1)$$

In equation (1.1), P1 represents the first average power consumption per unit time, P2 represents the second average power consumption per unit time, and IR is a version influence evaluation value. If the IR calculated according to the equation (1.1) is positive, the processor 11 may determine that the target version of the target application has the first abnormal power consumption state. However, if the IR is negative, the processor 11 may determine that the target version of the target application does not have the first abnormal power consumption state.

According to an embodiment, one or at least a part of the first determination operation, the second determination operation, and the third determination operation may be used in combination. For example, in the embodiment in which the first determination operation, the second determination operation, and the third determination operation are used simultaneously, in response to that the power consumption per unit time of the target application whose current version is the target version is higher than Q times standard deviation of the power consumption per unit time of the target application in past P unit time, the target application whose current version is the target version has a moving average rate of increase in the power consumption per unit time over R unit time higher than the first threshold, and the IR calculated according to the equation (1.1) is positive, the processor 11 may determine that the target version of the target application has the first abnormal power consumption state. On the contrary, if the power consumption per unit time of the target application whose current version is the target version is not higher than Q times standard deviation of the power consumption per unit time of the target application in past P unit time, the target application whose current version is the target version does not have a moving average rate of increase in the power consumption per unit time over R unit time higher than the first threshold, and/or the IR calculated according to the equation (1.1) is negative, the processor 11 may determine that the target version of the target application does not have the first abnormal power consumption state.

According to an embodiment, after determining that the target version of the target application has the first abnormal power consumption state, the processor 11 may also add the target version of the target application to an abnormal version list and update the abnormal version list. For example, the updated abnormal version list may reflect that the target version of the target application has the abnormal power consumption state.

According to an embodiment, the processor 11 may determine whether a specific application (also called a first candidate application) of multiple applications (also called candidate applications) has an abnormal power consumption state (also called a second abnormal power consumption state). In particular, the second abnormal power consumption state is an abnormal power consumption state evaluated based on the first candidate application itself. When the second abnormal power consumption state is detected, in response to the second abnormal power consumption state, the processor 11 may set the first candidate application as the target application.

According to an embodiment, the processor 11 may determine whether the first candidate application has the second abnormal power consumption state according to a determination result of the first determination operation and/or the second determination operation. For example, in response to that power consumption per unit time of the first candidate application is higher than Q times standard deviation of the power consumption per unit time of the first candidate application in past P unit time, and/or the first candidate application has a moving average rate of increase in the power consumption per unit time over R unit time higher than a first threshold, the processor 11 may determine that the first candidate application has the second abnormal power consumption state. Meanwhile, the processor 11 may set the first candidate application as the target application. Next, the processor 11 may determine whether the target version of the target application has the first abnormal power consumption state according to a determination result of the third determination operation.

According to an embodiment, the operation of determining whether the first candidate application has the second abnormal power consumption state according to determination results of the first determination operation and/or the second determination operation may also be regarded as abnormal power consumption detection for the application itself. The subsequent operation of determine whether the target version of the target application has the first abnormal power consumption state according to the determination result of the third determination operation may be regarded as abnormal power consumption detection for different versions of the application.

According to an embodiment, by first performing the abnormal power consumption detection of the application itself, an application (.i.e., a target application) that may have abnormal power consumption due to factors such as version changes may be preliminarily screened out from a large number of applications. After filtering out the target application, further version influence evaluation value (i.e. IR in equation (1.1)) is used to confirm whether the abnormal power consumption is indeed caused by a specific version of the application (i.e. the target version). According to an embodiment, through a two-stage mechanism for detecting an application program version with abnormal power consumption, the detection efficiency of the application program version causing abnormal power consumption may be effectively improved.

Figure 3:
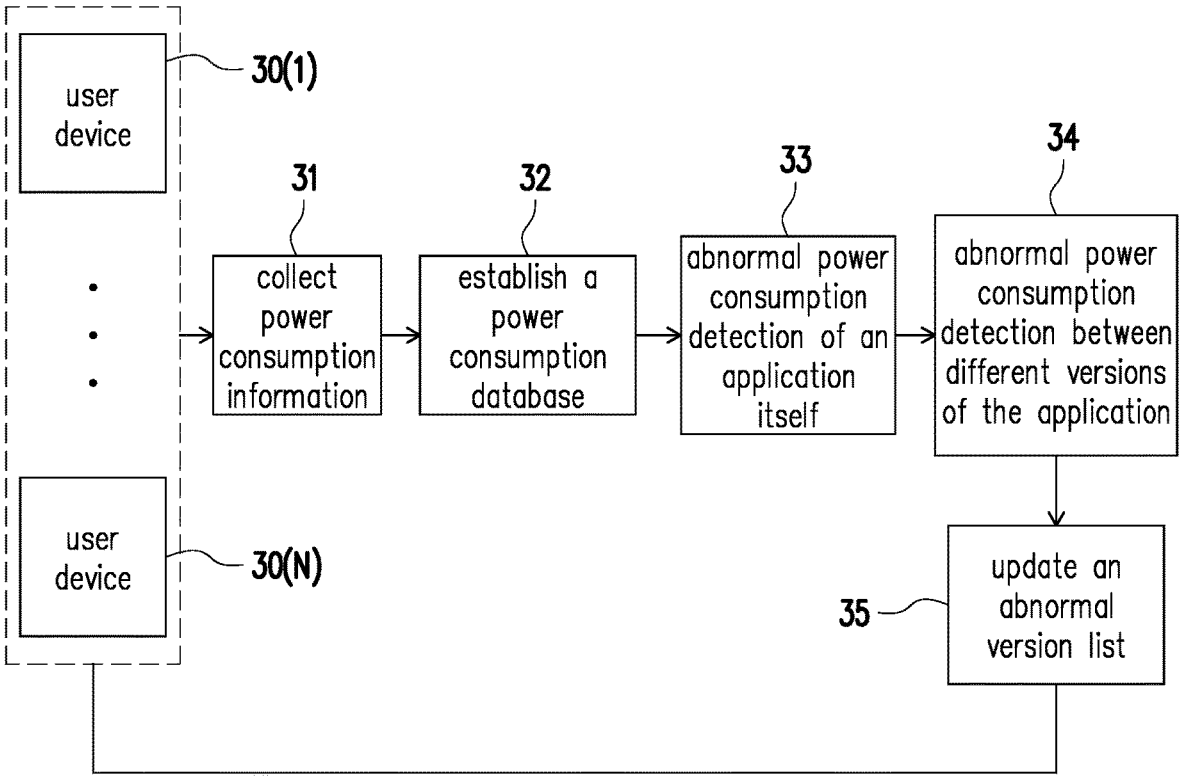
FIG. 3 is a schematic diagram of a two-stage mechanism for detecting an application program version with abnormal power consumption according to an embodiment of the disclosure.

Referring to FIG. 1 and FIG. 3, in step 31, the processor 11 may continuously collect power consumption information from user devices 30(1) to 30(N). For example, the collected power consumption information may reflect the power consumption information of one or more applications and/or versions of applications running in the user devices 30(1) to 30(N). In step 32, the processor 11 may establish a power consumption database according to the collected power consumption information. In step 33, the processor 11 may perform abnormal power consumption detection of the application itself. For example, step 33 may be regarded as a first stage detection in the two-stage mechanism for detecting an application program version with abnormal power consumption to filter out the application (i.e. the target application) that may have abnormal power consumption due to factors such as version changes from a large number of applications. For example, step 33 may include the first determination operation and/or the second determination operation.

After determining the target application, in step 34, the processor 11 may perform abnormal power consumption detection between different versions of the application. For example, step 34 may be regarded as a second stage detection in the two-stage mechanism for detecting an application program version with abnormal power consumption to confirm whether the abnormal power consumption is indeed caused by a specific version of the application (i.e. the target version). For example, step 34 may include the third determination operation.

After determining that the target version of the target application has the first abnormal power consumption state, in step 35, the processor 11 may update the abnormal version list of the applications. For example, the processor 11 may add the target version of the target application to the abnormal version list and update the abnormal version list. In addition, in step 35, the processor 11 may generate an abnormal power consumption prompt corresponding to the target version of the target application. For example, the abnormal power consumption prompt may be published on an online platform and/or provided to a user device having the target application (or the target version of the target application) for the user's review. In this way, users may clearly know whether a specific application or a specific version is causing abnormal power consumption of the electronic device at the moment or in the past, so that they can implement solutions, such as restoring the previous version and/or reporting abnormal application versions.

Referring to FIG. 4, in step S401, multiple versions of the power consumption database of the target application are established. In step S402, the power consumption information of the target version of the target application is obtained. In step S403, according to the power consumption database and the power consumption information, whether the target version of the target application has a first abnormal power consumption state evaluated based on different versions of the target application is determined. In step S404, in response to the first abnormal power consumption state, an abnormal power consumption prompt corresponding to the target version of the target application is generated.

Each step in FIG. 4 has been described in detail as above, and therefore will not be repeated in the following. It should be noted that each step in FIG. 4 may be implemented as multiple codes or circuits, which is not limited in this disclosure. In addition, the method of FIG. 4 may be used with the above exemplary embodiments, or may be used alone, which is not limited in this disclosure.

To sum up, the method and system for detecting an application program version with abnormal power consumption provided in this disclosure may evaluate whether a specific version of an application has abnormal power consumption based on different versions of the application, instead of simply detecting abnormal power consumption by the difference in power consumption between the application itself or applications. In this way, users may clearly know whether a specific application or a specific version is causing abnormal power consumption of the electronic device at the moment or in the past, so that they can implement solutions, such as restoring the previous version and/or reporting abnormal application versions.

It will be apparent to those skilled in the art that various modifications and variations can be made to the disclosed without departing from the scope or spirit of the disclosure. In view of the foregoing, it is intended that the disclosure covers modifications and variations provided that they fall within the scope of the following claims and their equivalents.

What is claimed is:

1. A method for detecting an application program version with abnormal power consumption, comprising:

collecting, by a processor, power consumption information of one or more applications running in a plurality of user devices;

establishing, by the processor, a power consumption database of a plurality of versions of a target application according to the power consumption information collected from the plurality of user devices and storing the power consumption database in a storage circuit coupled to the processor;

determining, by the processor, whether a target version of the target application is in a first abnormal power consumption state according to the power consumption database and power consumption information of the target version of the target application comprising:

obtaining, by the processor, the power consumption information of the target version of the target application including power consumption per unit time of the target version of the target application by accessing the power consumption database stored in the storage circuit, and in response to that the target application whose current version is the target version has a moving average rate of increase in the power consumption per unit time over R unit time higher than a first threshold, determining that the target version is in the first abnormal power consumption state, wherein R is a positive integer greater than 1;

in response to the first abnormal power consumption state, generating, by the processor, an abnormal power consumption prompt corresponding to the target version, and transmitting the abnormal power consumption prompt to a user device having target version of the target application with the first abnormal power consumption state; and in response to the abnormal power consumption prompt, restoring a previous version of the target application which is previous to the target version of the target application.

2. The method for detecting an application program version with abnormal power consumption according to claim 1, wherein the versions of the target application comprise a first version of the target application and a second version of the target application, and version information of the first version is different from version information of the second version.

3. The method for detecting an application program version with abnormal power consumption according to claim 1, wherein determining whether the target version of the target application is in the first abnormal power consumption state according to the power consumption database and the power consumption per unit time included in the power consumption information of the target version of the target application comprises:

in response to that the power consumption per unit time of the target version meets a default condition, determining that the target version has the first abnormal power consumption state.

4. The method for detecting an application program version with abnormal power consumption according to claim 3, wherein determining whether the target version of the target application is in the first abnormal power consumption state according to the power consumption database and the power consumption per unit time included in the power consumption information of the target version of the target application comprises:

in response to that the power consumption per unit time of the target application whose current version is the target version is higher than Q times standard deviation of the power consumption per unit time of the target application in past P unit time, determining that the target version has the first abnormal power consumption state, wherein P and Q are both positive integers greater than 1.

5. The method for detecting an application program version with abnormal power consumption according to claim 1, further comprising:

determining whether a first candidate application of a plurality of candidate applications has a second abnormal power consumption state evaluated based on the first candidate application itself, and in response to the second abnormal power consumption state, setting the first candidate application as the target application.

6. A method for detecting an application program version with abnormal power consumption, comprising:

collecting, by a processor, power consumption information of one or more applications running in a plurality of user devices;

establishing, by the processor, a power consumption database of a plurality of versions of a target application according to the power consumption information collected from the plurality of user devices and storing the power consumption database in a storage circuit coupled to the processor;

obtaining, by the processor, power consumption information of a target version of the target application by accessing the power consumption database stored in the storage circuit;

determining, by the processor, according to the power consumption database and power consumption per unit time included in the power consumption information of the target version of the target application, whether the target version of the target application is in a first abnormal power consumption state comprising:

obtaining a first average power consumption per unit time of the target application regardless of version by accessing the power consumption database stored in the storage circuit;

obtaining a second average power consumption per unit time of remaining versions of the target application other than the target version by accessing the power consumption database stored in the storage circuit; and determining whether the target version has the first abnormal power consumption state according to a difference between the first average power consumption per unit time and the second average power consumption per unit time;

in response to the first abnormal power consumption state, generating, by the processor, an abnormal power consumption prompt corresponding to the target version, and transmitting the abnormal power consumption prompt to a user device having target version of the target application with the first abnormal power consumption state; and in response to the abnormal power consumption prompt, restoring a previous version of the target application which is previous to the target version of the target application.

7. A system for detecting an application program version with abnormal power consumption, comprising:

a storage circuit; and a processor, coupled to the storage circuit, wherein the processor is configured to:

collect power consumption information of one or more applications running in a plurality of user devices;

establish a power consumption database of a plurality of versions of a target application according to the power consumption information collected from the plurality of user devices and storing the power consumption database in a storage circuit coupled to the processor;

obtain power consumption information of a target version of the target application by accessing the power consumption database stored in the storage circuit;

determine, according to the power consumption database and power consumption per unit time included in the power consumption information of the target version of the target application, whether the target version of the target application is in a first abnormal power consumption state, and operations comprise:

obtaining a first average power consumption per unit time of the target application regardless of version by accessing the power consumption database stored in the storage circuit;

obtaining a second average power consumption per unit time of remaining versions of the target application other than the target version by accessing the power consumption database stored in the storage circuit; and determining whether the target version has the first abnormal power consumption state according to a difference between the first average power consumption per unit time and the second average power consumption per unit time;

in response to the first abnormal power consumption state, generate an abnormal power consumption prompt corresponding to the target version, and transmit the abnormal power consumption prompt to a user device having target version of the target application with the first abnormal power consumption state; and in response to the abnormal power consumption prompt, restore a previous version of the target application which is previous to the target version of the target application.

8. The system for detecting an application program version with abnormal power consumption according to claim 7, wherein the versions of the target application comprise a first version of the target application and a second version of the target application, and version information of the first version is different from version information of the second version.

9. The system for detecting an application program version with abnormal power consumption according to claim 7, wherein the processor determines, according to the power consumption database and the power consumption per unit time included in the power consumption information of the target version of the target application, whether the target version of the target application is in the first abnormal power consumption state, and operations comprise:

in response to that the power consumption per unit time of the target version meets a default condition, determining that the target version has the first abnormal power consumption state.

10. The system for detecting an application program version with abnormal power consumption according to claim 9, wherein the processor determines, according to the power consumption database and the power consumption per unit time included in the power consumption information of the target version of the target application, whether the target version of the target application is in the first abnormal power consumption state, and operations comprise:

in response to that the power consumption per unit time of the target application whose current version is the target version is higher than Q times standard deviation of the power consumption per unit time of the target application in past P unit time, determining that the target version has the first abnormal power consumption state, wherein P and Q are both positive integers greater than 1.

11. The system for detecting an application program version with abnormal power consumption according to claim 9, wherein the processor determines, according to the power consumption database and the power consumption per unit time included in the power consumption information of the target version of the target application, whether the target version of the target application is in the first abnormal power consumption state, and operations comprise:

in response to that the target application whose current version is the target version has a moving average rate of increase in the power consumption per unit time over R unit time higher than a first threshold, determining that the target version has the first abnormal power consumption state, wherein R is a positive integer greater than 1.

12. The system for detecting an application program version with abnormal power consumption according to claim 7, wherein the processor is further configured to:

determine whether a first candidate application of a plurality of candidate applications has a second abnormal power consumption state evaluated based on the first candidate application itself; and in response to the second abnormal power consumption state, set the first candidate application as the target application.

* * * * *